US006708797B2

(12) United States Patent
Long et al.

(10) Patent No.: US 6,708,797 B2
(45) Date of Patent: Mar. 23, 2004

(54) DISPLAY ENCLOSURE HAVING THIN SPEAKER

(75) Inventors: Joseph D. Long, Greensboro, NC (US); Jonathan A. Gromatzky, Kernersville, NC (US)

(73) Assignee: Gilbarco Inc., Greensboro, NC (US)

(*) Notice: Subject to any disclaimer, the term of this patent is extended or adjusted under 35 U.S.C. 154(b) by 389 days.

(21) Appl. No.: 09/840,471

(22) Filed: Apr. 23, 2001

(65) Prior Publication Data

US 2002/0164044 A1 Nov. 7, 2002

(51) Int. Cl.[7] .......................... H05K 5/00; G03B 21/56; H04R 25/00

(52) U.S. Cl. ....................... 181/149; 381/152; 381/388; 381/333; 381/431; 381/306; 359/444

(58) Field of Search ................................ 181/149, 148, 181/150, 199; 381/152, 162, 388, 333, 395, 191, 431, 306; 359/444, 445; 353/15–19

(56) References Cited

U.S. PATENT DOCUMENTS

| | | | | |
|---|---|---|---|---|
| 4,352,961 | A | 10/1982 | Kumada et al. | 179/110 A |
| 4,385,210 | A | 5/1983 | Marguiss | 179/114 M |
| 4,857,887 | A | 8/1989 | Iten | 341/34 |
| 4,932,485 | A | 6/1990 | Mori | 177/25.15 |
| 4,984,445 | A | 1/1991 | Ohuchi et al. | 72/360 |
| 5,170,195 | A | 12/1992 | Akiyama et al. | 353/54 |
| 5,400,414 | A | 3/1995 | Thiele | 381/190 |
| D357,198 | S | 4/1995 | Gatley | D10/94 |
| 5,488,385 | A | 1/1996 | Singhal et al. | 345/3 |
| 5,606,341 | A | 2/1997 | Aguilera | 345/87 |
| 5,647,151 | A | 7/1997 | Fantone et al. | 40/454 |
| 5,665,938 | A | 9/1997 | Boshear et al. | 174/50 |
| 5,694,141 | A | 12/1997 | Chee | 345/1 |
| 5,717,564 | A | 2/1998 | Lindale | 361/600 |
| 5,748,269 | A | 5/1998 | Harris et al. | 349/58 |
| 5,791,770 | A | 8/1998 | Hoyt et al. | 362/294 |
| 5,828,768 | A | 10/1998 | Eatwell et al. | 381/333 |
| 5,961,289 | A | 10/1999 | Lohmann | 416/189 |
| 6,026,866 | A | 2/2000 | Nanaji | 141/59 |
| 6,052,629 | A | 4/2000 | Leatherman et al. | 700/241 |
| 6,104,451 | A | 8/2000 | Matsuoka et al. | 349/58 |
| 6,151,401 | A | 11/2000 | Annaratone | 381/388 |
| 6,176,421 | B1 | 1/2001 | Royal, Jr. et al. | 231/381 |

OTHER PUBLICATIONS

"Brushless DC Cross Flow Fan CFS Series".

*Primary Examiner*—Robert Nappi
*Assistant Examiner*—Edgardo San Martin
(74) *Attorney, Agent, or Firm*—Withrow & Terranova PLLC

(57) ABSTRACT

The present invention relates to a LCD display that has a thin depth, rigid enclosure and includes a thin speaker so that the depth of the enclosure does not have to be increased to accommodate the speaker. The speaker is used to generate audio output that may correlate to the graphical information displayed on the LCD display. The enclosure has an opening for inclusion of a semi-rigid lens for viewing of an internal LCD module that is also used as a planar surface for the thin speaker. In order to provide a thin device in the enclosure that is driven by a driver to move air to generate sound, the driver is attached to the semi-rigid lens.

18 Claims, 6 Drawing Sheets

DISPLAY ENCLOSURE HAVING THIN SPEAKER

FIELD OF THE INVENTION

The present invention relates to a liquid crystal display (LCD) display that uses part of the LCD display enclosure as part of a thin speaker.

BACKGROUND OF THE INVENTION

LCD displays are commonly used today in devices that require information to be displayed in human-perceptible form. LCD displays are typically comprised of an enclosure, a LCD module, backlights and supporting electronics. Since LCD displays use thin depth LCD modules to display information as opposed to larger-in-depth cathode ray tube (CRT) displays for similar sized screens, LCD displays are often used in devices that have packaging and/or space constraints. Unlike LCD displays, the tube in a CRT display increases substantially in depth as the screen size increases.

Electronic devices, such as fuel dispensers and automatic teller machines (ATM) for example, use displays to deliver information to users of these devices. Such information may be instructions on how to use the machine. It may also be desirable for these displays to be associated with a speaker or other audio output device to give audio feedback that correlates to the information being delivered on the display. For example, an advertisement with sound could be directed to a person standing in front of the LCD display, or instructions on how to interact with the LCD display could be given in audio sound.

One advantage of using a LCD display is that the LCD module used in the display is thin in depth thereby allowing the LCD display to be thin in depth as well. A LCD display is usually placed in an enclosure that must be large enough to hold all of the components of the LCD display, including the LCD module. It is advantageous to make the LCD display and its components take up as little space as possible so that a smaller enclosure may be used for packaging, aesthetics, and cost factors. A larger enclosure is likely to cost more than a smaller enclosure due to the extra material needed to construct a larger enclosure.

However, certain desired components of the LCD display may defeat the advantage of using a thin depth LCD module. For example, a speaker provided in the LCD display may include a cone that moves air to generate sound. Speaker cones can be large in depth thereby requiring the enclosure to be larger in size than would otherwise be needed had a speaker not been included in the LCD display. Further, if the enclosure is environmentally-sealed, such as a display enclosure commonly used for outdoor environments, a cone speaker cannot be used in the enclosure since a cone speaker requires an air leak in the enclosure to properly emit sound. A piezoelectric speaker does not require an air leak in the enclosure, but may require extra amplifiers that add to the cost of the LCD display. These additional amplifiers may also increase the ambient air temperature inside the enclosure, which can cause other problems as discussed in co-pending patent application Ser. No. 09/840,338, now U.S. Pat. No. 6,493,440 entitled "Thermal management for a thin environmentally-sealed LCD display enclosure," filed on Apr. 23, 2001.

Therefore, a need exists to provide a thin LCD display enclosure that includes a speaker that: (1) is thin so that the size of the enclosure does not have to be increased to accommodate the speaker; and (2) does not increase of the temperature of the ambient air inside the LCD display enclosure in a significant way.

SUMMARY OF THE INVENTION

The present invention relates to a LCD display that has a thin depth enclosure and includes a thin speaker so that the depth of the enclosure does not have to be increased to accommodate the speaker. The speaker is used to generate audio output that may correlate to the graphical information displayed on the LCD display.

In one embodiment, a magnetic driver is attached to a lens placed into an opening in a rigid enclosure for the LCD display. The magnetic driver moves the lens inward and outward to generate sound. The lens may be transparent if required for viewing of the LCD module in the LCD display.

In another embodiment, the lens is not attached to the rigid enclosure. The lens is constructed to fit totally inside the opening. A membrane or semi-rigid surface is placed on the outside of the rigid enclosure and attached to both the rigid enclosure and the lens for greater speaker performance.

In another embodiment, the mounting bracket that holds the magnetic driver and attaches the magnetic driver to the lens is also attached to the lens. In this manner, the lens has an increased inflection when the magnetic driver pushes the lens inward and outward for greater speaker performance.

The LCD display may be placed in any type of electronic device, including but not limited to a kiosk, a fuel dispenser, a personal computer, an elevator display, and an automated teller machine (ATM). The LCD display may display information and other instructions to a user of an electronic device incorporating the LCD display. If the LCD display has a touch screen, the LCD display may also act as an input device.

Those skilled in the art will appreciate the scope of the present invention and realize additional aspects thereof after reading the following detailed description of the preferred embodiments in association with the accompanying drawing figures.

BRIEF DESCRIPTION OF THE DRAWINGS

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The present invention relates to a LCD display that has a thin depth enclosure and includes a thin speaker so that the depth of the enclosure does not have to be increased to accommodate the speaker. The speaker is used to generate audio output that may correlate to the graphical information displayed on the LCD display.

Figure 1:
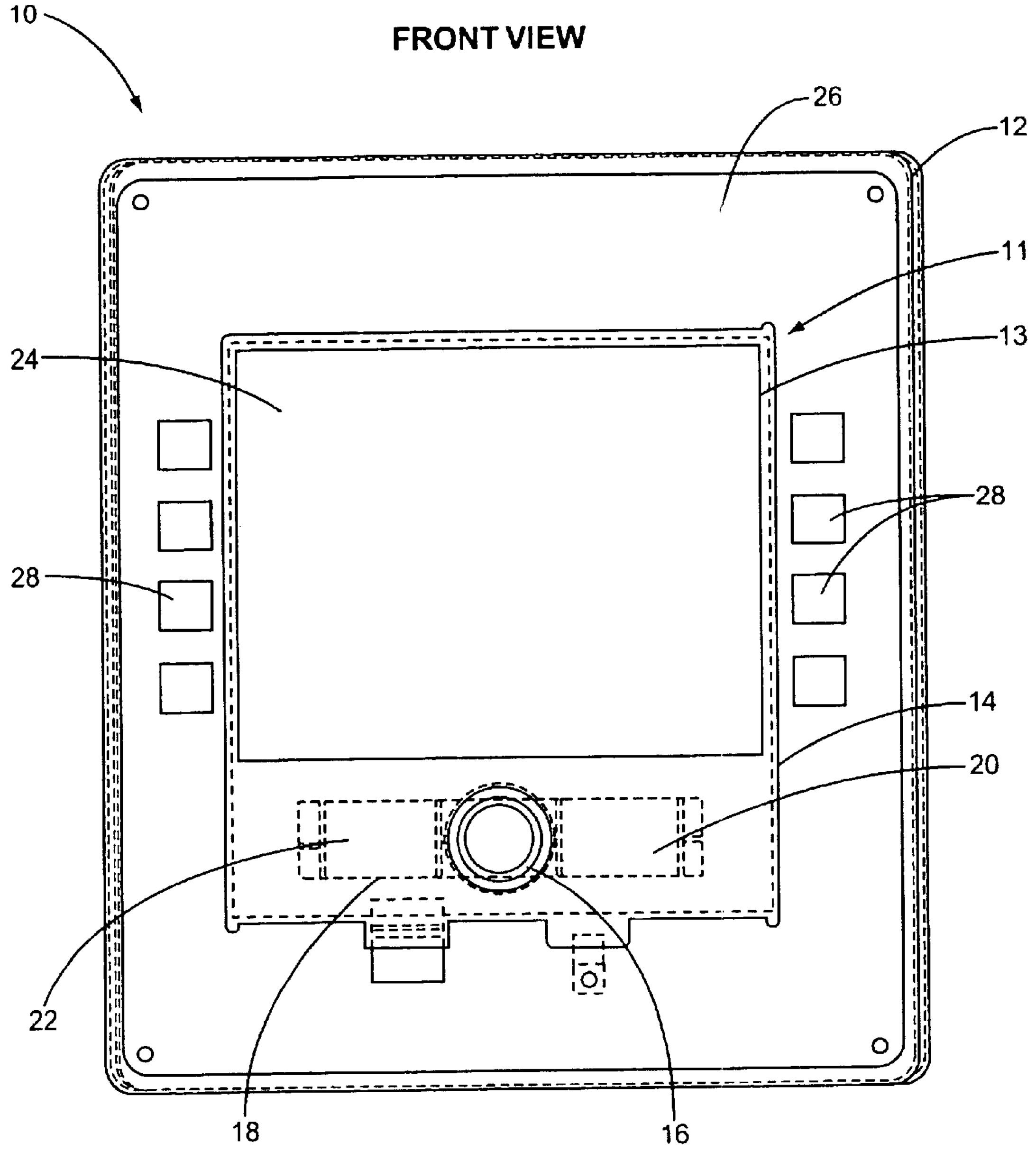
FIG. 1 is a schematic diagram of the front view of a LCD display including the thin speaker according to the present invention.

FIG. 1 illustrates a LCD display 10 according to the present invention. The LCD display 10 includes a thin speaker 11 so that audio output can be generated by the LCD display 10. The LCD display 10 comprises a rigid enclosure 12 that is constructed out of any suitable rigid material for protection of the internal LCD display 10 components, including, but not limited to, sheet metal, aluminum, and copper. The rigid enclosure 12 includes an opening 13 in front of the rigid enclosure 12 so that a LCD module 24 placed inside the LCD display 10 can be viewed externally. In this embodiment, the depth of the rigid enclosure 12 is less than or equal to 35 millimeters.

A lens 14 is placed in the opening 13 so that the opening 13 in the enclosure 12 is filled and thus sealed from the environment. The lens 14 is resilient and attached to the edges on the opening 13 on the rigid enclosure 12 to form a seal. However, the lens 14 may be smaller in dimension than the opening 13 if another surface is placed over the opening 13 on the outside of the rigid enclosure 13 that attaches to both the rigid enclosure 12 and the lens 14. If the LCD module 24 inside the rigid enclosure 12 is to still be viewable, the lens 14 must include at least a transparent portion. In the present embodiment, the lens 14 is completely transparent and is constructed out of a material known as "Lexan." However, the lens 14 may be constructed out of any material, whether transparent or not, including, but not limited to, plastic, glass, and Plexiglas.

The thin speaker 11 is accomplished by vibrating a planar surface in the LCD display 10 inward and outward to generate sound. The rigid enclosure 12 is constructed out of a rigid material that may not be easily moveable inward and outward to create sound thereby making for a poor planar surface. At the same time, the rigid enclosure 12 must not include substantial openings to air that compromise the internal components of the LCD display, such as intrusion by environmental elements. Since the rigid enclosure 12 must provide a lens 14 in the opening 13 for viewing of the LCD module 24, a lens 14 may be selected that is less rigid than the rigid enclosure 12 or semi-rigid so that the lens 14 may be driven inwardly and outwardly more easily that the rigid enclosure 12 to act as the planar surface to generate sound.

A magnetic driver 16 is included in the LCD display 10 that is driven by a voltage signal to move the lens 14. The magnetic driver 16 includes a diaphragm 38 (illustrated in FIG. 3) that is attached to the lens 14. The magnetic driver 16 moves the diaphragm 38 inward and outward in response to a voltage signal placed onto a coil (not shown) in the magnetic driver 16 to generate sound. The magnetic driver 16 is mounted onto a mounting bracket 18 so that the magnetic driver 16 is held in place securely inside the LCD display 10. The mounting bracket 18 has a left end 20 and a right end 22, as viewed from inside the enclosure 12, and the magnetic driver 16 is mounted in between the left end 20 and the right end 22.

For improved performance, the lens 14 may be constructed to a dimension so that it fits inside the opening 13 of the rigid enclosure 12 without attaching directly to the rigid enclosure 12. A semi-rigid surface 26 may be on the outside of the rigid enclosure 12 that is larger in dimension than both the lens 14 and the opening 13. The semi-rigid surface 26 attaches to both the rigid enclosure 12 and to the lens 14 so that a small gap exists around the edges of the lens 14 and between the edge of the lens 14 and the opening 13 when viewed from inside the rigid enclosure 12. The semi-rigid surface 26 may be constructed out of any semi-rigid material. The semi-rigid surface 26 must include a transparent portion that aligns with a transparent portion of the lens 14 if the LCD module is to be viewable through both the lens 14 and the semi-rigid surface 26.

Inclusion of the semi-rigid surface 26 on the outside of the rigid enclosure 12, as discussed in the preceding paragraph, allows the lens 14 and magnetic driver 16 to float like a drumhead resulting in greater audio output efficiency. The semi-rigid surface 26 allows the lens 14 to move inward and outward in greater distances and with less energy exerted by the magnetic driver 16 on the lens 14. However, as previously discussed, the lens 14 can still act as an effective planar surface to be driven by the magnetic driver 16 to generate sound even if the lens 14 covers the entire dimensions of the opening 13 and is attached to the rigid surface 12.

One type of semi-rigid surface 26 that may be used with the present invention is a membrane 26. A membrane 26 is a semi-rigid and resilient surface that includes thin buttons or keys as input devices. The membrane 26 includes thin electrical wiring connections to couple the input devices to another source. The membrane 26 may also include an adhesive (not shown) that allows the entire surface of the membrane 26 to be attached to the rigid enclosure 12 and lens 14. In the embodiment illustrated in FIG. 1, the membrane 26 includes soft keys 28 that are aligned with portions of the LCD module 24 so that a person can enter selections on the soft keys 28 that correlate to selection choices displayed on the LCD module 24.

Another aspect of the present invention that allows the thin speaker 12 to operate with greater efficiency is the placement of mounting bracket 18 that mounts the magnetic driver 16 to the lens 14. As illustrated in FIG. 1, the mounting bracket 18 is also attached to the lens 14. This allows the lens 14 to more fully bend inward and outward with shaper inflection points during bending. When the magnetic driver 16 pushes outward on the lens 14, the pressure exerted by the magnetic driver 16 outward causes the ends 20, 22 of the mounting bracket 18 to inflect inward thereby causing the curvature of the lens 14 to have a greater inflection. Similarly, when the magnetic driver 16 pushes inward on the lens 14, the pull by the magnetic driver 16 inward on the lens 14 causes the ends 20, 22 of the mounting bracket 18 to inflect outward thereby causing the curvature of the lens 14 to have a greater inflection as well. However, the mounting bracket 18 may be mounted in another location than on the lens 14 for the thin speaker 11 to operate property so long as the magnetic driver 16 is attached to the lens 14.

Figure 2:
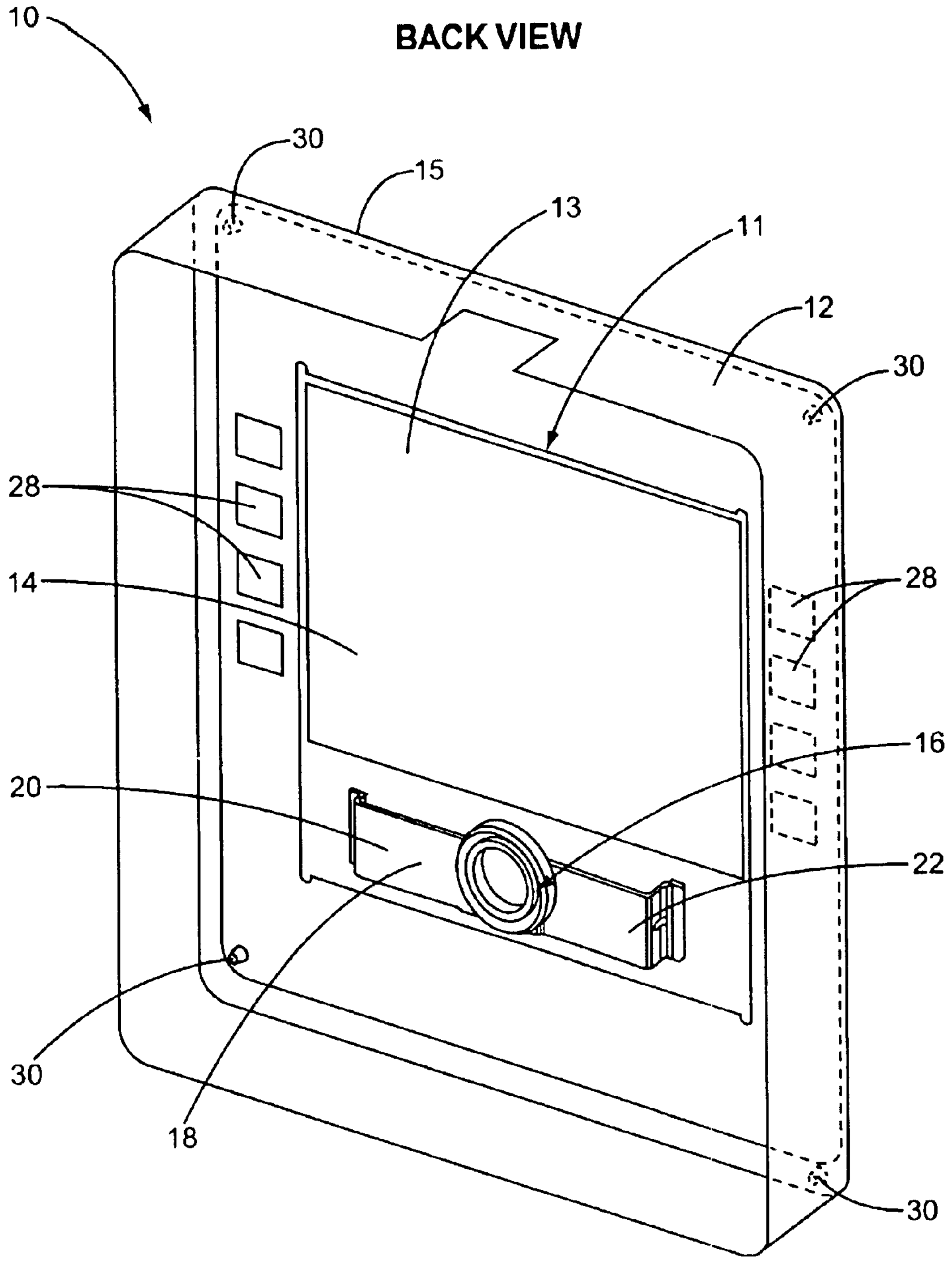
FIG. 2 is a schematic diagram of the rear view of a LCD display including the thin speaker according to the present invention.

FIG. 2 illustrates the rear view of the LCD display 10 and thin speaker 11. The rigid enclosure 12 is comprised of two portions, a front portion 15 and a back portion (not shown). The back portion of the rigid enclosure 12 is designed to have a slightly less dimensional size than the front portion 15 so that the back portion can be placed inside the front portion of the rigid enclosure 12 to complete the enclosure 12. Fasteners 30 are provided at the inside corners of the front portion 15 and the back portion contains female fittings aligned with the fasteners 30 so that the front portion 15 and the back portion may be securely attached to each other.

Figure 3:
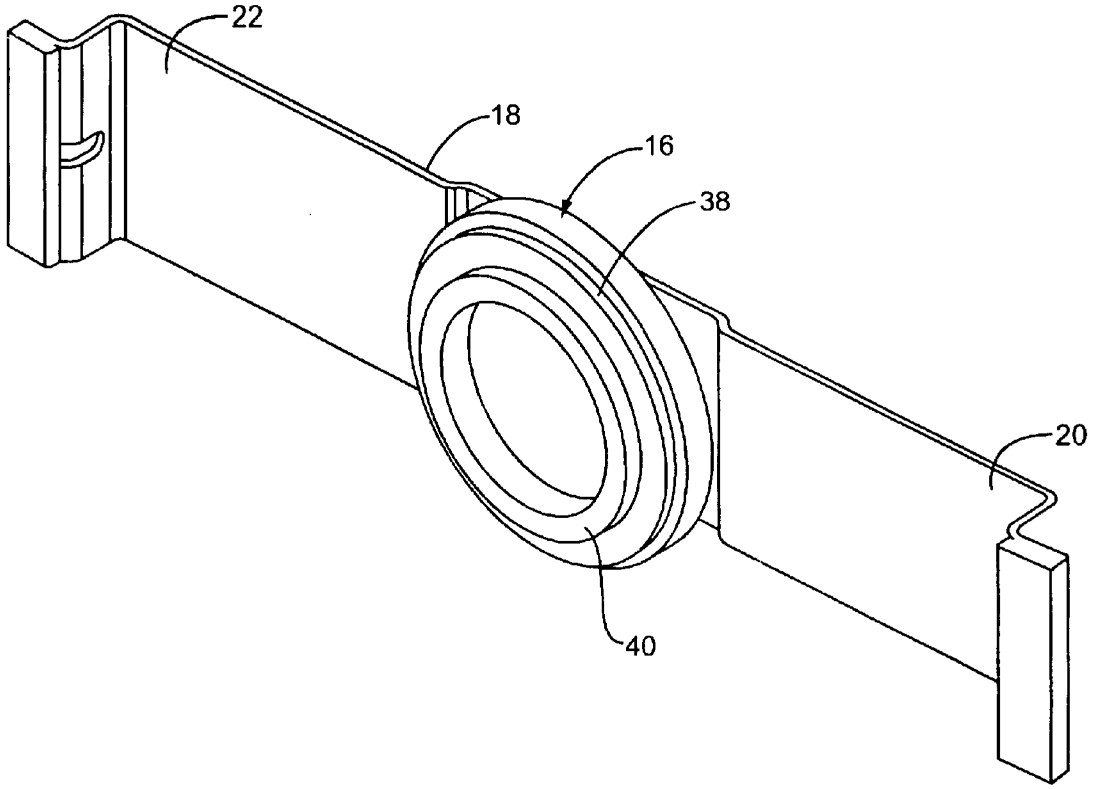
FIG. 3 PRIOR ART
FIG. 3 is a schematic diagram of one speaker driver embodiment in the prior art that may be used with the present invention.

FIG. 3 illustrates one type of magnetic driver 16 known in the prior art that is manufactured by Kodel Corporation. The magnetic driver 16 comprises a diaphragm 38 that moves inward and outward in relation to a voltage signal applied to a magnetic coil (not shown) in the magnetic consistency driver 16. A driver contact surface 40 is connected to the outside of the diaphragm 38 and is connected to the lens 14 so that the lens 14 is moved inward and outward as the diagram 38 is moved inward and outward by the magnetic driver 16. It is readily known to one of ordinary skill in the art that magnetic drivers 16 are common and can be readily interchanged with one another, and the present invention is not limited to a particular type of magnetic driver 16 to drive the lens 14 to provide the thin speaker 11.

Figure 4:
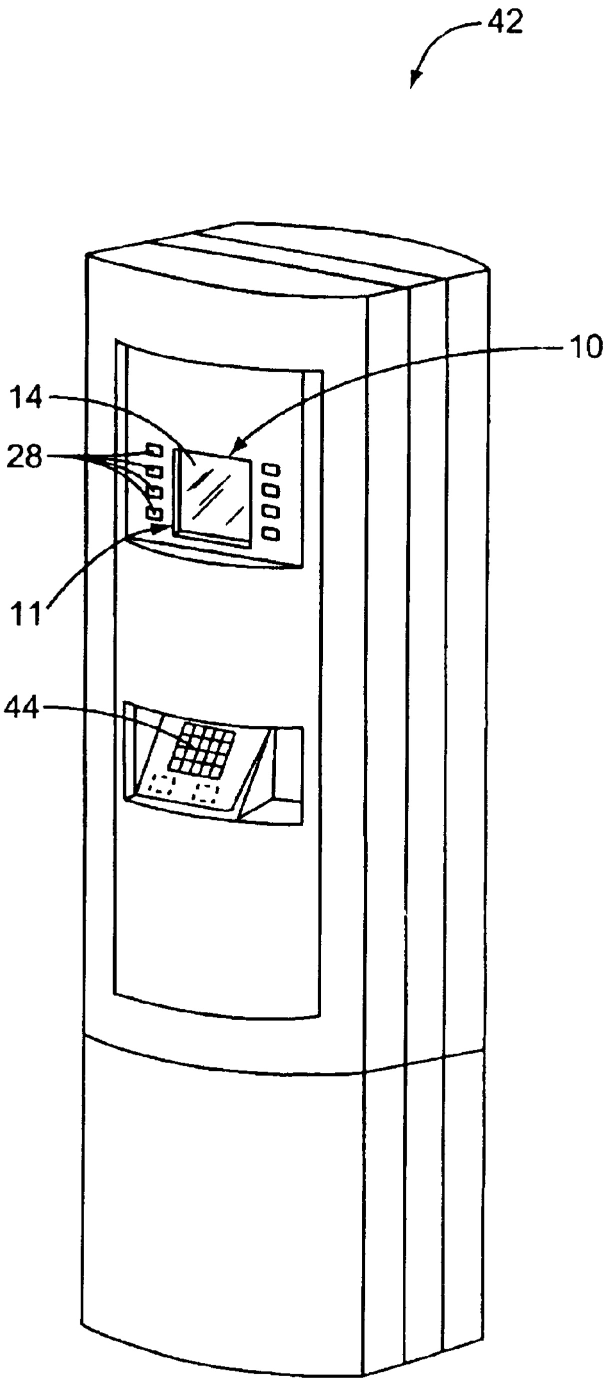
FIG. 4 is a schematic diagram of a kiosk that includes the LCD display and thin speaker according to one embodiment of the present invention.

FIG. 4 illustrates one embodiment of a device that incorporates the LCD display 10 known as a "kiosk" 42. A kiosk 42 is any type of interactive electronic device that provides an input device, an output device, or both. Kiosks 42 are typically used in retail environments to sell products and/or services to customers. Some common types of kiosk 42 include vending machines, fuel dispensers, automatic teller machines (ATM), and the like. FIG. 4 illustrates one example of a kiosk 42 that includes the LCD display 10 and thin speaker 11 illustrated in FIG. 1 as output devices for displaying information. Soft keys 28 are located on each side of the LCD display 10 as an input device for customer selections; however, an input device may also take others forms, such as a keypad 44, touch screen keys on the LCD display 10 (not shown), card entry device, magnetic or optically encoded cards, voice recognition, or the like.

The LCD display 10 and thin speaker 11 of the present invention is suited for kiosks 42 that are located in outdoor environments where the rigid enclosure 12 of the LCD display 10 is environmentally-sealed. However, the LCD display 10 may be placed in any type of kiosk 42 regardless of whether the kiosk 42 is placed in an outdoor environment.

Figure 5:
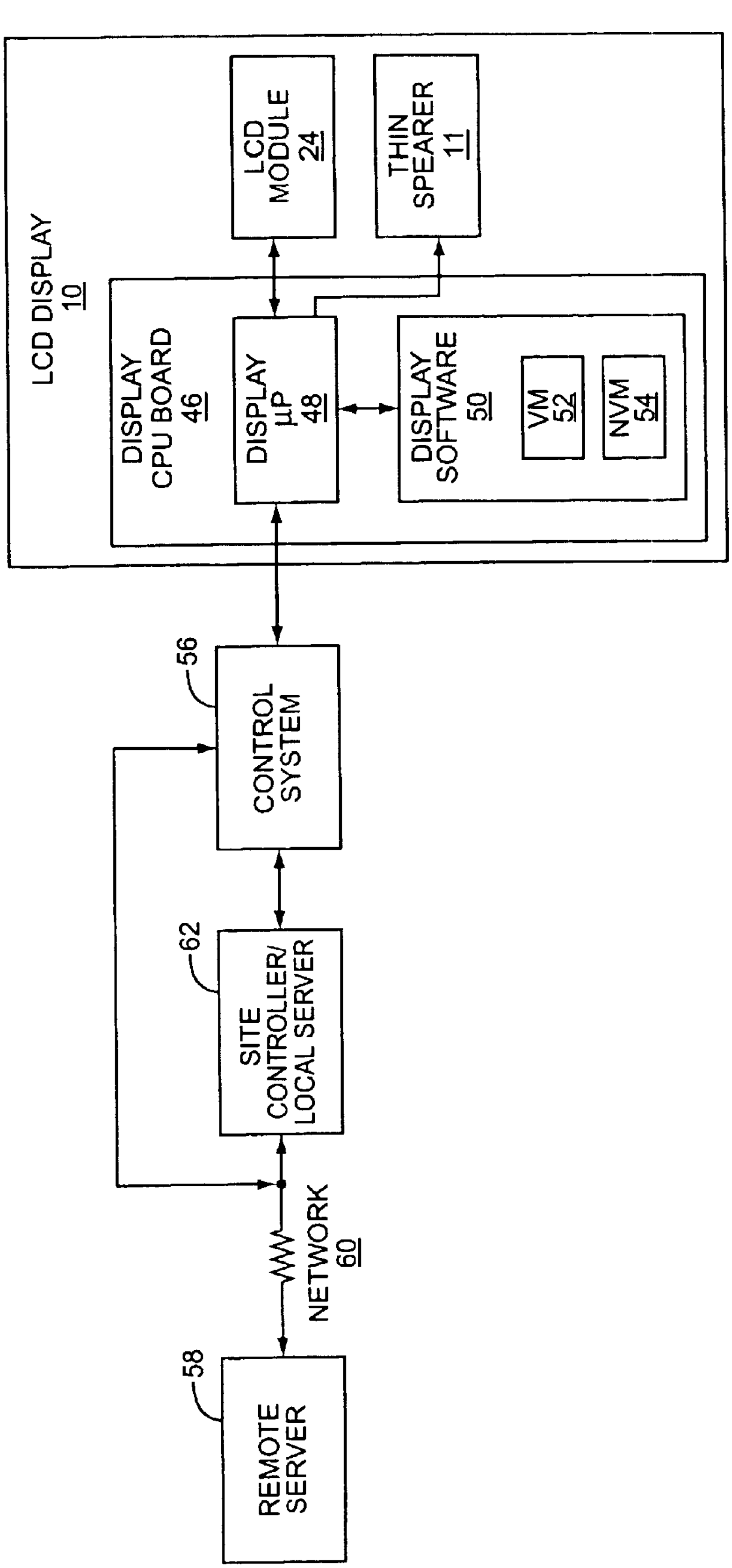
FIG. 5 is a schematic diagram of one embodiment of the LCD display electronics architecture.

FIG. 5 illustrates one embodiment of a communication architecture used for the LCD display 10. The LCD display 10 comprises a display CPU board 46 that contains electronics and software. In this particular embodiment, the display CPU board 46 contains a single display microprocessor 48 and display software 50. The display software 50 contains both volatile memory 52, such as RAM and/or flash memory, and non-volatile memory 54, such as EPROM and/or EEPROM. The display software 50 contains program instructions for the display microprocessor 48 and may also contain information to be displayed on the LCD module 24. The display microprocessor 48 may also manage information received from external sources and control the operation of the LCD module 24. The display microprocessor 48 also controls the magnetic driver 16 in the thin speaker 11 to drive the semi-rigid lens 16 in the LCD display 10 to produce sound.

In this embodiment, information is communicated from one or more external devices to the display microprocessor 48 to then be displayed on the LCD module 24. A control system 56 is provided as the interface to the display microprocessor 48. The control system 56 may be coupled to more than one display microprocessor 42 for managing multiple LCD modules 24.

The main controller 50 may also be connected to a site controller or local server 62 located in close proximity to the LCD display 10 that sends information to be displayed on the LCD module 24. The local server 62 may be a point-of-sale system, for example. A remote server 58, located remotely from the LCD display 10, may also be provided to send information to the LCD module 24. The remote server 58 may send information over a network 60 directly to the display microprocessor 48, through the control system 50, and/or through the local server 62 to be eventually displayed on the LCD module 24. The remote server 58, the local server 62, the control system 50, and the display microprocessor 48 may be coupled each other through either a wired or wireless connection or network 60 using any type of communication technology, including but not limited to the Internet, serial or parallel bus communication, radio-frequency communication, optical communication, etc.

Examples of Internet information management that may be used with the present invention to send information to a LCD display 10 and/or communicate information entered into a LCD display 10 having a touch screen or other electronic device incorporating an LCD display 10 are disclosed in U.S. Pat. Nos. 6,052,629 and 6,176,421 entitled "Internet capable browser dispenser architecture" and "Fuel dispenser architecture having server" respectively, both of which are incorporated herein by reference in their entirety.

Figure 6:
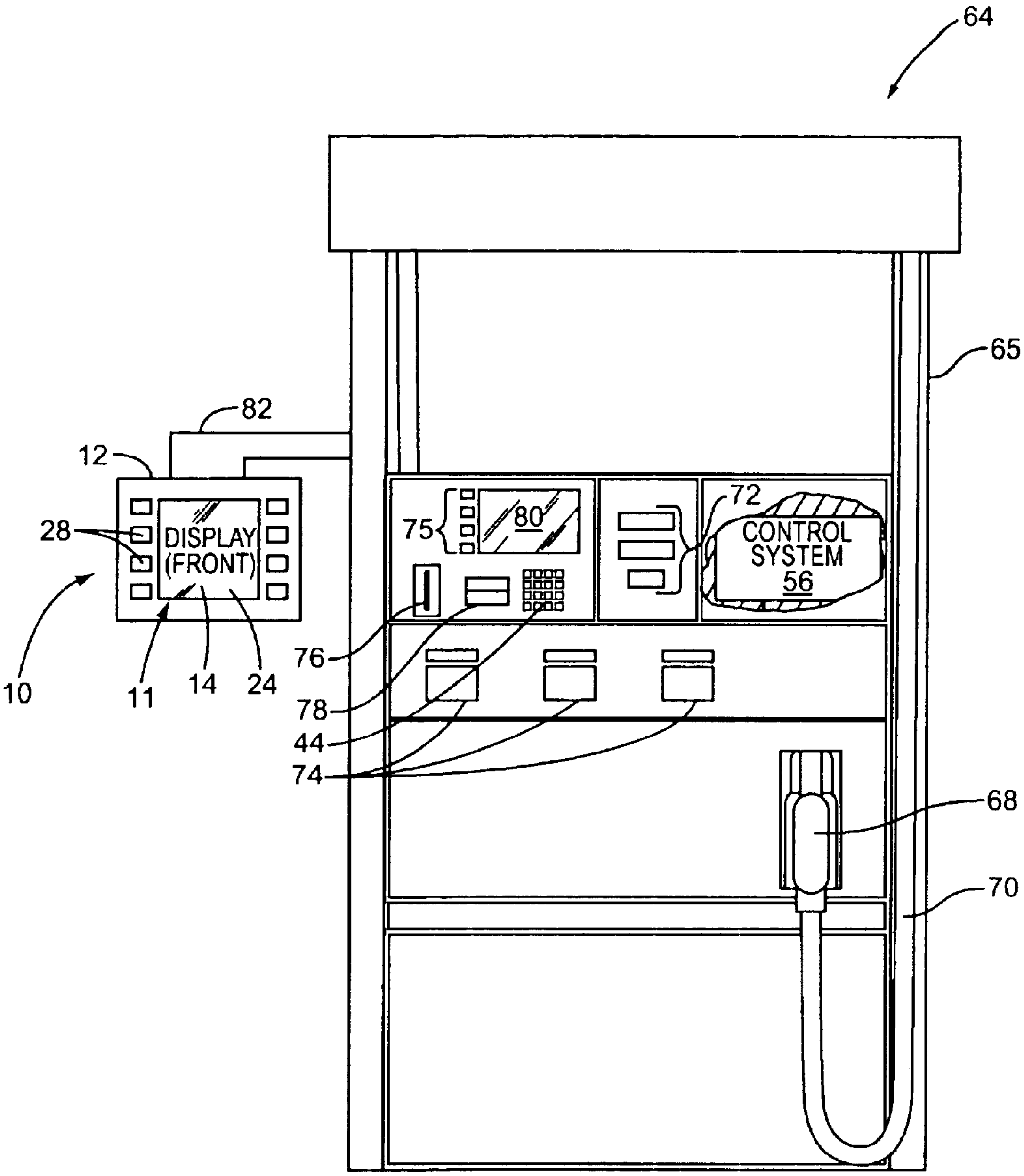
FIG. 6 is a schematic diagram of a fuel dispenser that includes the LCD display and thin speaker according to one embodiment of the present invention.

FIG. 6 illustrates another exemplary outdoor device known as a "fuel dispenser" 64 that may incorporate the LCD display 10 of the present invention. A fuel dispenser 64 may also be considered a type of kiosk 42 depending on its configuration and features. The illustrated fuel dispenser 64 contains a LCD display 10 for providing instructions and/or information to a customer at the fuel dispenser 64. The fuel dispenser 64 is comprised of a housing 65 and at least one energy-dispensing outlet, such as a hose 70 and nozzle 68 combination, to deliver fuel to a vehicle (not shown). The fuel dispenser 64 may have other input and/or output devices for interaction with a customer, such as transaction total displays 72, octane selection buttons 74. soft keys 75 for a main display 80, unrelated to the LCD display 10 from a hardware standpoint, a card reader 76, and a receipt printer 78.

The LCD display 10 is placed external to the fuel dispenser 64 and is attached to the fuel dispenser 64 using an arm 82. More information on methods of attaching an external LCD display 10 to a fuel dispenser 64 is described in co-pending application Ser. No. 09/840,642, entitled "Add-on display for fuel dispenser," filed on Apr. 23, 2001 and incorporated herein by reference in its entirety.

Certain modifications and improvements will occur to those skilled in the art upon a reading of the foregoing description. It should be understood that the present invention is not limited to any particular type of component in the LCD display 10 including, but not limited to, the rigid enclosure 12, lens 14, magnetic driver 16, mounting bracket 18, LCD module 24, and semi-rigid surface 26. Additionally, the LCD display 10 with the thin speaker 11 may be used in any type of device having or using a display, including but not limited, to a personal computer, a kiosk 42, an elevator, an ATM, and a fuel dispenser 64. Also for the purposes of this application, couple, coupled, or coupling is defined as either a direct connection or a reactive coupling. Reactive coupling is defined as either capacitive or inductive coupling.

The embodiments discussed above represent the necessary information to enable those skilled in the art to practice the invention and illustrate the best mode of practicing the invention. Upon reading the prior description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Those skilled in the art will recognize improvements and modifications to the preferred embodiments of the present invention. All such improvements and modifications are considered within the scope of the concepts disclosed herein and the claims that follow and their equivalents.

What is claimed is:

1. A thin speaker, comprising:

a rigid enclosure having an opening that is smaller in size than the dimensions of said rigid enclosure;

a semi-rigid lens placed in said opening;

a magnetic driver inside of said rigid enclosure and attached to said semi-rigid lens wherein said magnetic driver vibrates said semi-rigid lens to create sound;

said semi-rigid lens is attached to a thin semi-rigid surface that is attached to the outside of said rigid enclosure.

2. The speaker of claim 1, wherein said magnetic driver further comprises a magnetic coil and a diaphragm attached to said semi-rigid lens.

3. The speaker of claim 1, wherein said semi-rigid lens is constructed from a material comprised from the group consisting of plastic; and glass.

4. The speaker of claim 1, wherein said semi-rigid lens is transparent.

5. The speaker of claim 1, wherein said rigid enclosure contains a LCD module that is viewable through said semi-rigid lens.

6. The speaker of claim 1, wherein said semi-rigid lens is attached to said rigid enclosure.

7. The speaker of claim 1, wherein said thin semi-rigid surface is larger in size than said semi-rigid lens.

8. The speaker of claim 1, further comprising a mounting bracket for attaching said magnetic driver to said semi-rigid lens.

9. The speaker of claim 8, wherein said mounting bracket is rectangular in shape and has a left end and a right end and said magnetic driver is attached in between said left end and said right end.

10. The speaker of claim 9, wherein said mounting bracket is attached to aid semi-rigid lens for increased vibration of said semi-rigid lens for increased sound volume.

11. The speaker of claim 8, wherein said mounting bracket is attached to said semi-rigid lens.

12. The speaker of claim 1, wherein said rigid enclosure is environmentally sealed.

13. A method of producing a thin speaker for an enclosure, comprising the steps of:

cutting out an opening in a rigid enclosure;

placing a semi-rigid lens in said opening;

attaching a magnetic driver on the de of said rigid enclosure to said semi-rigid lens wherein said magnetic driver vibrates said semi-rigid lens to create sound, placing a semi-rigid surface on the outside of said rigid enclosure; and attaching said semi-rigid lens to said semi-rigid surface.

14. The method of claim 13, wherein said attaching comprises:

attaching said magnetic driver to a mounting bracket and to said semi-rigid lens; and attaching said magnetic driver to said semi-rigid lens.

15. The method of claim 13, further comprising environmentally-sealing said rigid enclosure.

16. The method of claim 13, further comprising attaching said rigid enclosure to a kiosk.

17. The method of claim 13, further comprising attaching said rigid enclosure to a fuel dispenser.

18. The method of claim 13, further comprising placing a LCD module on the inside of said rigid enclosure that is viewable through said semi-rigid lens.

* * * * *